(12) United States Patent
Tatt et al.

(10) Patent No.: US 6,882,035 B2
(45) Date of Patent: Apr. 19, 2005

(54) DIE PACKAGE

(75) Inventors: Koay Hean Tatt, Penang (MY); Tan Gin Ghee, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/616,534

(22) Filed: Jul. 9, 2003

(65) Prior Publication Data

US 2005/0006735 A1 Jan. 13, 2005

(51) Int. Cl.[7] .............................................. H01L 23/495
(52) U.S. Cl. ........................ 257/676; 257/691; 257/692
(58) Field of Search ................................ 257/666–676, 257/690–694

(56) References Cited

U.S. PATENT DOCUMENTS 5,457,340 A * 10/1995 Templeton et al. ......... 257/666

2001/0008305 A1 * 7/2001 McLellan et al. ........... 257/692

* cited by examiner

*Primary Examiner*—Nathan J. Flynn
*Assistant Examiner*—Leonardo Andujar

(57) ABSTRACT

A packaged die having a die pad, leads, and a power ring is disclosed. The die includes an electrical circuit thereon and is attached to the die pad. The leads are arranged around the die pad with at least one of the leads being connected to the die. The power ring includes a conductor disposed between the leads and the die pad, at least one power connection on the die being connected to the power ring. A layer of encapsulating material covers the die, die pad, the power ring, and the leads. The layer has a top surface, a bottom surface, and side surfaces. Each of the leads includes a conductor having a portion thereof exposed on the bottom surface. In addition, a portion of the conductor in the power ring is exposed on the bottom surface. In one embodiment, the exposed portions of the conductors include solder balls.

4 Claims, 6 Drawing Sheets

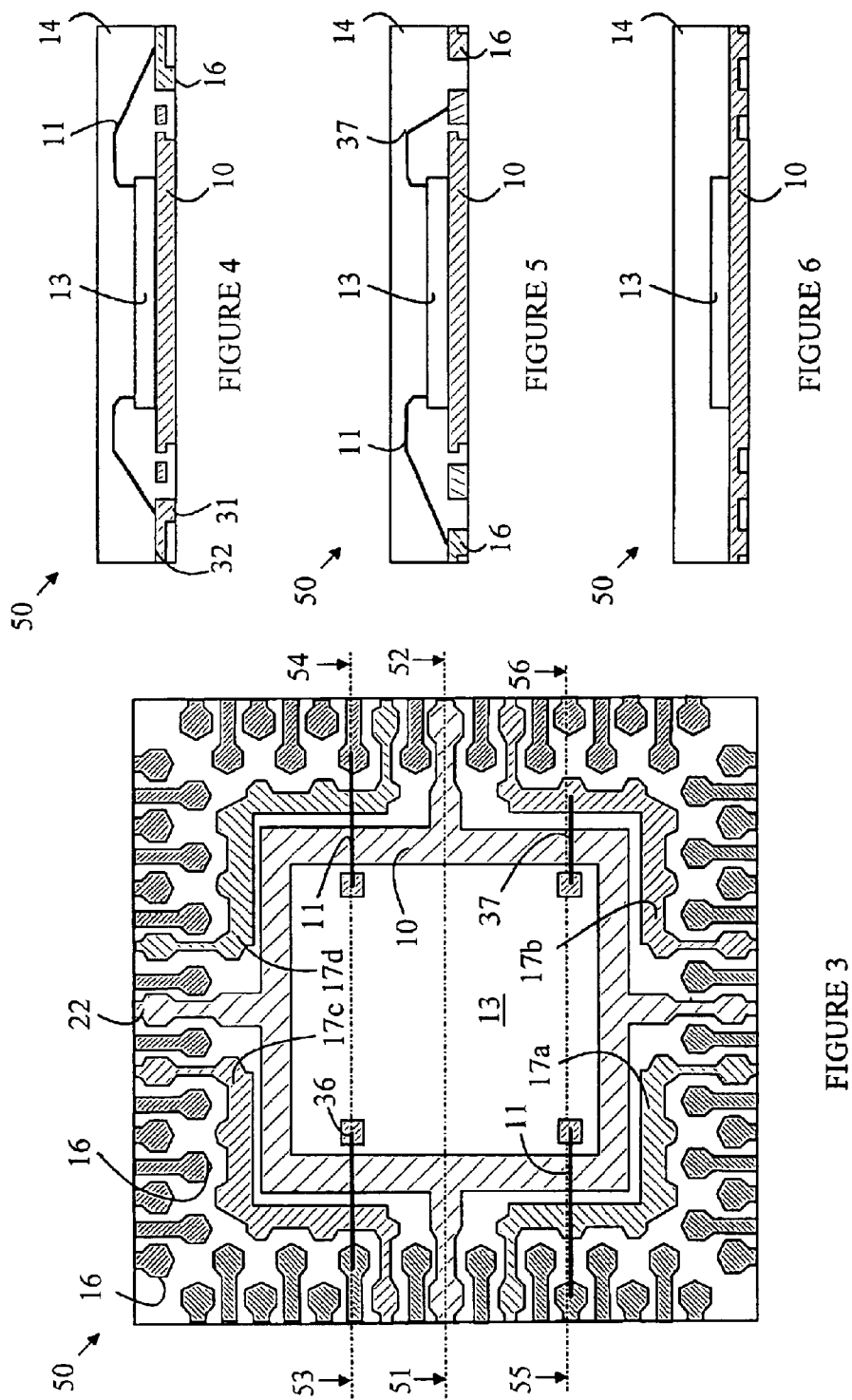

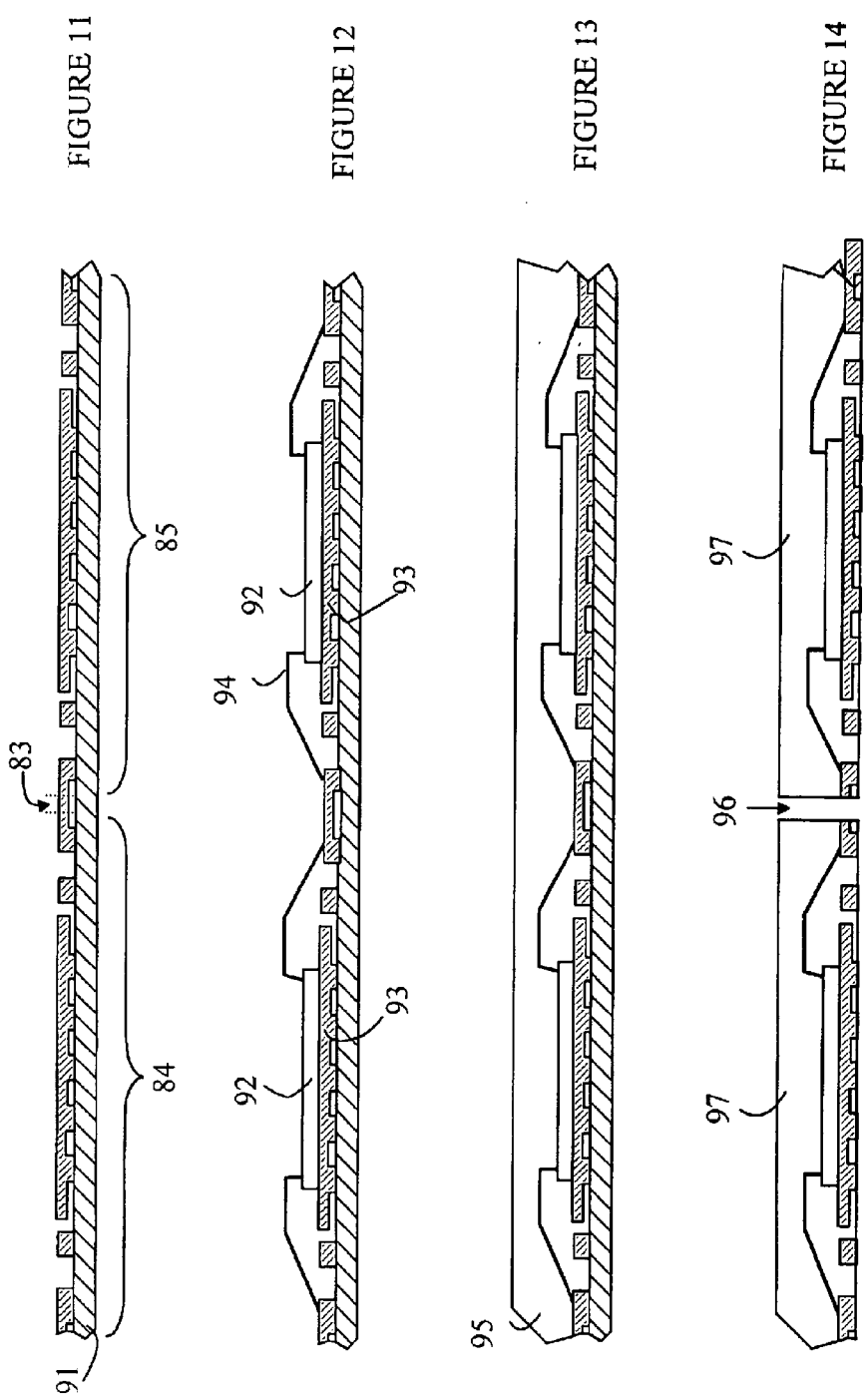

US 6,882,035 B2

DIE PACKAGE

FIELD OF THE INVENTION

The present invention relates to semiconductor packages.

BACKGROUND OF THE INVENTION

Semiconducting devices are typically fabricated on dies that include a number of connection pads for connecting the circuitry contained on the die to external circuitry. A die is normally packaged in an encapsulating material to protect the die and to provide connections between the pads on the die and connectors that are better adapted for making connections to the external circuitry via traces on printed circuit boards and the like.

One class of semiconductor package utilizes a thin metal carrier that is commonly referred to as a "lead frame" to provide the connections between the die and the connectors that mate with external connectors on the printed circuit board. Examples of such packages are taught in U.S. Pat. Nos. 6,400,004 and 6,433,377. In this type of package, the die is typically attached to one portion of the lead frame. Thin gold wires are then connected between each pad on the die and a corresponding internal connector located on the periphery of the lead frame using a wire-bonding process. The lead frame, die, and connecting wires are then encapsulated in a plastic material that protects the die and provides mechanical strength.

While this type of package is economical, it has a number of disadvantages. First, the I/O connections to the die circuitry are located around the periphery of the lead frame. This arrangement limits the number of I/O connections that can be made to the die. As integrated circuits become more complex, this limitation becomes more troublesome.

Second, power and ground connections are typically made through pins that are similar to the I/O pins. The power connections must run from the peripheral connectors of the lead frame to the die via relatively long wires. This limits the current that can be provided to the chip. This can be particularly problematic in high power circuitry.

Third, the amount of heat that can be dissipated by the package is limited. The encapsulating material impedes heat dissipation via the top surface of the package. While the die is attached to a pad in the lead frame pad, the lead frame sits on the printed circuit board. The amount of heat that can be transferred depends on the contact area and heat resistance of that area. In general, the heat leaving via the lead frame pad is impeded by poor thermal connections between the bottom of the package and the printed circuit board.

SUMMARY OF THE INVENTION

The present invention includes a packaged die having a die pad, leads, and a power ring. The die includes an electrical circuit thereon and is attached to the die pad. The leads are arranged around the die pad with at least one of the leads being connected to the die. The power ring includes a conductor disposed between the leads and the die pad, at least one power connection on the die being connected to the power ring. A layer of encapsulating material covers the die, die pad, the power ring, and the leads. The layer has a top surface, a bottom surface, and side surfaces. Each of the leads includes a conductor having a portion thereof exposed on the bottom surface. In addition, a portion of the conductor in the power ring is exposed on the bottom surface. In one embodiment, the exposed portions of the conductors include solder balls. In another embodiment, the die pad, leads, and power ring each extend to at least one of the side surfaces. In another embodiment, each of the leads includes a conductor having a portion thereof that is not exposed on the bottom surface. In addition, a portion of the conductor in the power ring is not exposed on the bottom surface in this embodiment.

BRIEF DESCRIPTION OF THE DRAWINGS

FIG. 3 is a top view of a packaged die 50 according to one embodiment of the present invention.

FIG. 4 is a cross-sectional view of packaged die 50 through line 53–54.

FIG. 5 is a cross-sectional view of packaged die 50 through line 55–56.

FIG. 6 is a cross-sectional view of packaged die 50 through line 51–52.

FIG. 7 is a bottom view of a package 60, which utilizes a land grid array for making connections to a printed circuit board or the like.

FIGS. 11–14 are cross-sectional views through line 81–82 shown in FIG. 10 at various stages in the packaging process.

DETAILED DESCRIPTION OF THE PREFERRED EMBODIMENTS OF THE INVENTION

Figures 1, 2:
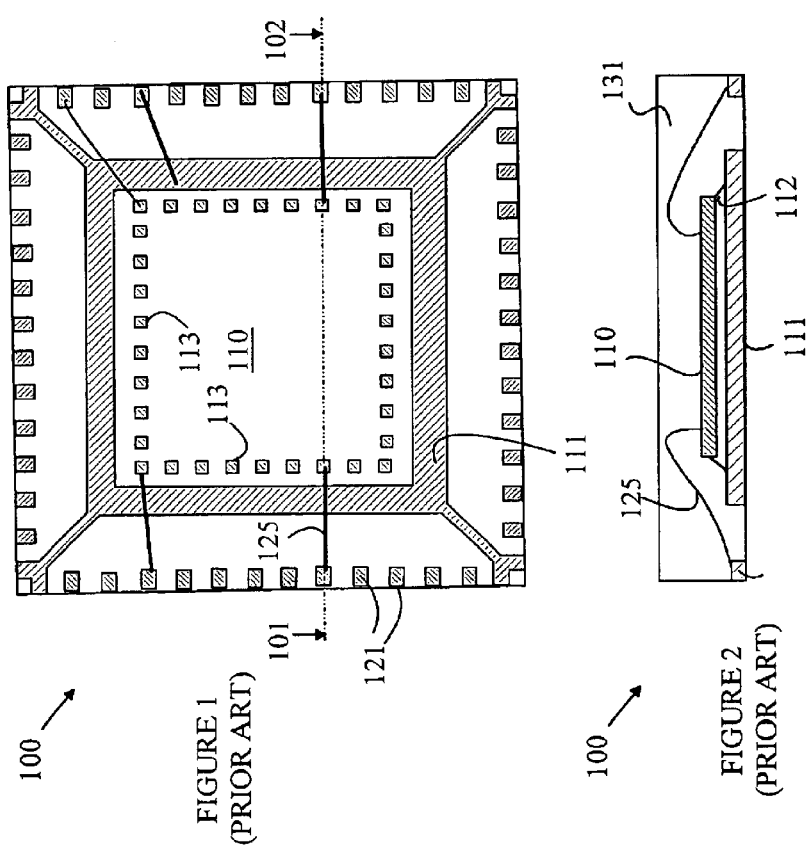
FIG. 1 is a top view of a prior art lead frame package 100 in which a die 110 is mounted on a lead frame and then encapsulated in a layer 131.
FIG. 2 is a cross-sectional view through line 101–102 shown in FIG. 1.

The manner in which the present invention provides its advantages can be more easily understood with reference to FIGS. 1 and 2, which illustrate a prior art lead frame package 100 in which a die 110 is mounted on a lead frame and then encapsulated in a layer 131. FIG. 1 is a top view of the package, and FIG. 2 is a cross-sectional view through line 101–102. The lead frame includes a die pad 111 and a plurality of I/O and power connection pads 121 that are located around the periphery of the lead frame. Die 110 is mounted on pad 111 via an adhesive layer 112. Die 110 includes a plurality of I/O and power connection pads. Typical connection pads are labeled 113 in the drawings. Connections are made between each of the connection pads 113 on the die and a corresponding one of the connection pads 121 in the lead frame via thin wires 125 that are bonded to the pads. After the die is connected to the lead frame and the wires bonded to the pad, the die and lead frame are encapsulated.

While the long thin wire connections do not usually pose problems for the I/O signals, the resistivity of the thin wires is sufficiently high to cause voltage drops if these wires are used for power and ground connections. In this regard, it should be noted that the distance between the pads of the die and the corresponding pads on the lead frame is relatively large. It would clearly be advantageous to minimize the length of the wires used for power and ground connections. However, the prior art lead frame packages do not provide a mechanism for accomplishing this goal.

The manner in which the present invention provides its advantages can be more easily understood with reference to FIGS. 3–6. FIG. 3 is a top view of a packaged die 50 according to one embodiment of the present invention. FIG. 4 is a cross-sectional view through line 53–54. FIG. 5 is a cross-sectional view through line 55–56, and FIG. 6 is a cross-sectional view through line 51–52.

Die 13 is attached to a die pad 10 in the lead frame using an adhesive layer. Die pad 10 is preferably connected at 4 locations to ground pads 22 on the outer ring of the signal connectors. To simplify the drawings, the adhesive layer has been omitted from the drawings. The circuits on die 13 are connected to I/O pads 16 on the outer ring of the signal connectors in lead frame by gold wires 11 that are wire bonded to pads 36 on die 13. The lead frame components and the die are encapsulated in a layer 14 of molding compound that provides structural integrity to the packaged part.

The lead frame also includes a power ring that is disposed around die pad 10 between the I/O pads and die pad 10. In the embodiment shown in FIGS. 3–6, the power ring includes a plurality of conductor segments shown at 17a–d. Each segment has a plurality of connection points that can be used to supply power to the segment thereby reducing the effective resistance of the power paths. In addition, by placing the conductor segments closer to the pads on die 13, the length of the connecting wires such as wire 37 is reduced compared to the length of the connecting wires that connect the signal pads to the I/O pads. Accordingly, the present invention can provide higher currents to die 13 than the prior art devices discussed above.

Referring to FIG. 4, each of the conducting lead frame components consists of a conducting layer having a portion 31 that is in contact with the bottom of the packaged die and a portion 32 that is separated from the bottom of the die and surrounded with encapsulating material. Portion 32 secures the component in the encapsulating layer and prevents the component from being pulled off of the bottom of the package. Portion 31 is used to make electrical connections to the component.

Figure 7:
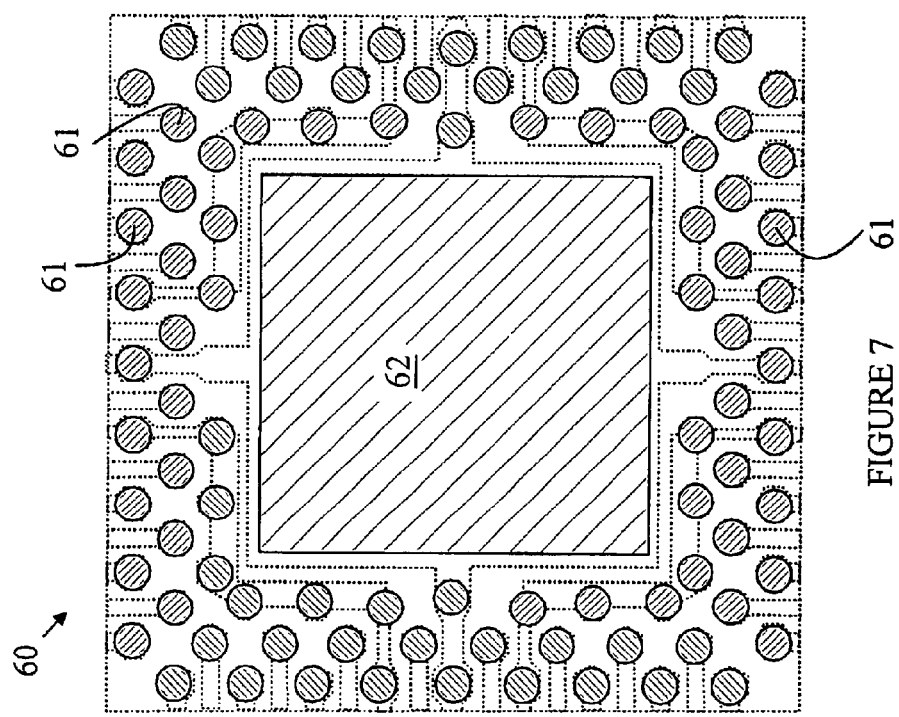

Refer now to FIG. 7, which is a bottom view of a package 60 according to an embodiment of the present invention which utilizes a land grid array for making connections to a printed circuit board or the like. The portions 31 of the conducting layers shown in FIG. 4 that are exposed on the bottom of the package and which are to make contact with mating conductors on the printed circuit board are shown at 61. In addition, the bottom 62 of the die pad is also exposed on the bottom of the package so that it is in contact with a corresponding ground layer on the printed circuit board. This provides a large area for conducting heat from the die to the ground plane of the printed circuit board where the heat is transferred to the air.

Figure 9:
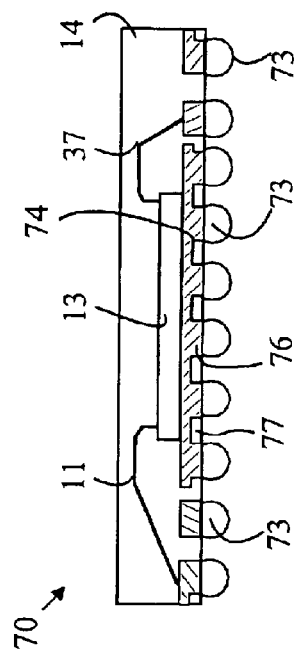
FIG. 9 is a cross-sectional view of package 70 through line 71–72.
Figure 8:
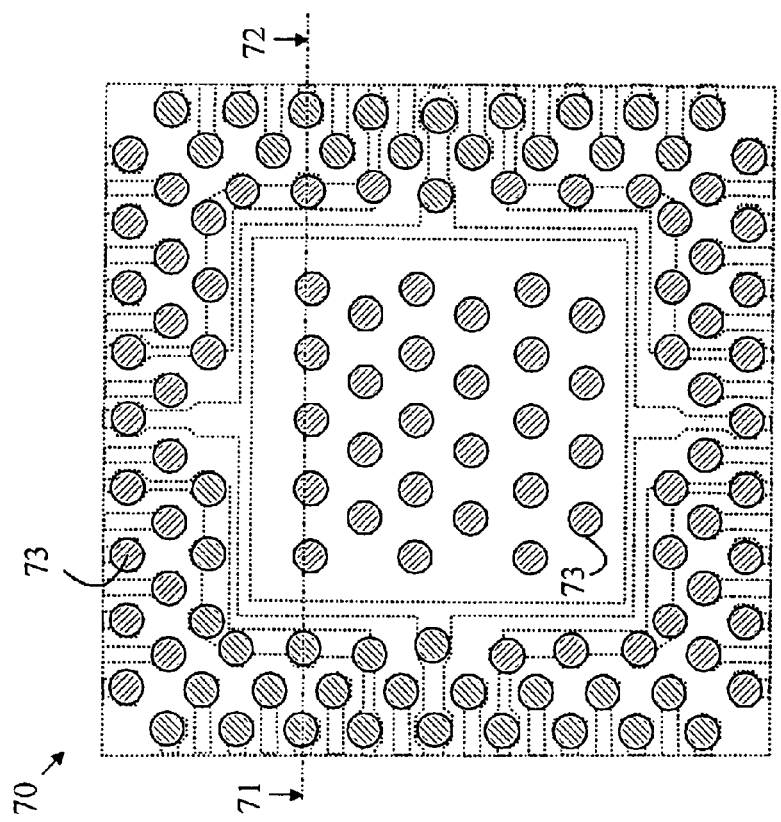
FIG. 8 is a bottom view of package 70 utilizing a ball grid array.

The present invention can also be utilized to construct a package utilizing a ball grid array. Refer now to FIGS. 8 and 9, which illustrate a package 70 according to an embodiment of the present invention that utilizes a ball grid array to make connections to the underlying printed circuit board. FIG. 8 is a bottom view of package 70, and FIG. 9 is a cross-sectional view of package 70 through line 71–72. To simplify the following discussion, those elements that serve the same function as elements shown in FIGS. 3–6 have been given the same numeric designations and will not be discussed further here. The die pad 74 in package 70 includes a plurality of discrete connection points that are exposed on the bottom of the package after the die and lead frame have been encapsulated in layer 14. The spaces 77 between the connection points 76 are filled with encapsulating material, and hence, the die pad is firmly held in the package. Solder balls 73 are attached to the connection points after the package is encapsulated.

Figure 10:
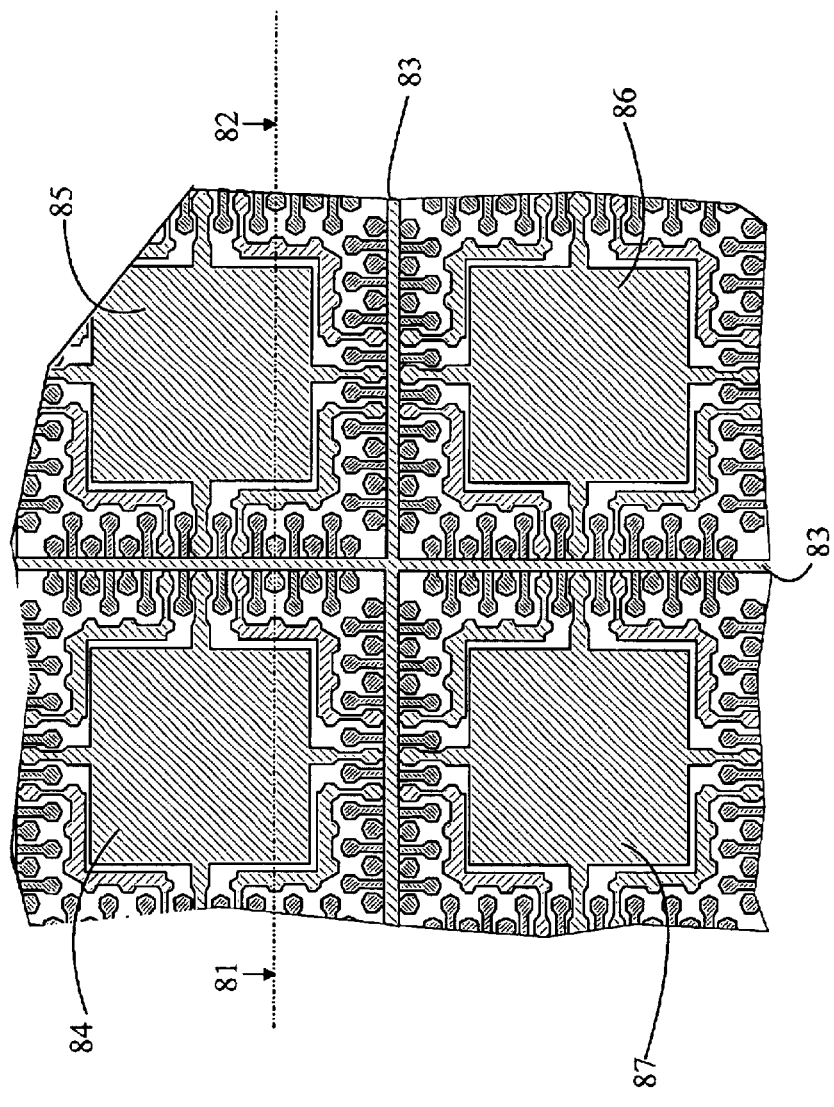
FIG. 10 is a top view of a portion of a sheet of lead frames illustrating a portion of four lead frames shown at 84–87 that are connected to one another around the periphery of each lead frame by a spine 83.

The manner in which the dies are packaged utilizing the present invention may be more easily understood with reference to FIGS. 10–14. In general, multiple dies are packaged as a group, and then the individual dies are separated from the group. FIG. 10 is a top view of a portion of a sheet of lead frames illustrating a portion of four lead frames shown at 84–87 that are connected to one another around the periphery of each lead frame by a spine 83. The spine is connected to all of the conducting elements of the lead frames. The sheet of lead frames can be fabricated by pattern etching a sheet of conductive material such as copper. Since the fabrication of such sheets is known in the packaging arts, the details of the fabrication of the sheet of lead frames will not be discussed here.

FIGS. 11–14 are cross-sectional views through line 81–82 shown in FIG. 10 at various stages in the packaging process. Referring to FIG. 11, the sheet of lead frames is initially bonded to a temperature resistant tape 91. The tape must be capable of withstanding the process conditions involved in wire bonding and encapsulation of the dies. In one preferred embodiment of the present invention, tapes made of polyimide are utilized.

Referring to FIG. 12, the dies 92 are then bonded to the die pads 93. Bonding agents such as conventional die attach epoxy can be utilized in the bonding operation. The electrical connections 94 between the die and the various signal and power conductors in the lead frame are then made utilizing conventional wire bonding techniques.

A layer 95 of encapsulating material is then applied over the sheet of lead frames as shown in FIG. 13. Any suitable encapsulating process can be utilized. For example, encapsulation processes in the form of a dam and fill process or in the form of a transfer mold process can be utilized. The encapsulating material flows under the raised portions of the lead frame thereby entrapping the lead frame, bound dies, and electrical connections into a single layer having sufficient rigidity to support itself.

After the encapsulating material has cured, the backing tape layer 91 is removed. This exposes the portions of the lead frame conductors that were previously in contact with the backing tape. If the devices are to connect to the underlying printed circuit board by a ball grid array, the solder balls can be applied at this point.

Finally, the individual packaged dies 97 are separated by making cuts 96 through the encapsulated sheet to remove spine 83. These cuts also separate the individual electrical conductors in each lead frame from one another. The spine is preferably located in a raised portion of the sheet of lead frames such that any spurs created by the cutting saw do not extend to the underlying printed circuit board when the packaged dies are connected to the printed circuit board.

Various modifications to the present invention will become apparent to those skilled in the art from the foregoing description and accompanying drawings. Accordingly, the present invention is to be limited solely by the scope of the following claims.

What is claimed is:

1. A packaged die comprising:

a die pad having a die having an electrical circuit thereon attached thereto;

a plurality of leads arranged around said die pad, at least one of said leads being connected to said die;

a power ring comprising a conductor disposed between said leads and said die pad, at least one power connection on said die being connected to said power ring; and a layer of encapsulating material covering said die, said die pad, said power ring, and said leads, said layer having a top surface, a bottom surface, and side surfaces, wherein each of said leads comprises a conductor having a portion thereof exposed on said bottom surface and wherein a portion of said conductor in said power ring is exposed on said bottom surface, wherein said exposed portions of each lead on said bottom surface are arranged such that each lead is connected to a corresponding one of said side surfaces and wherein said leads connected to at least one of said side surfaces comprise a first one of said leads that has said exposed portion at different distances from that side surface than said exposed portion of a second one of said leads connected to that side surface.

2. The packaged die of claim 1 wherein said exposed portions of said conductors further comprise solder balls.

3. The packaged die of claim 1 wherein said die pad, said leads, and said power ring each extend to at least one of said side surfaces.

4. The packaged die of claim 1 wherein each of said leads comprises a conductor having a portion thereof that is not exposed on said bottom surface and wherein a portion of said conductor in said power ring is not exposed on said bottom surface.

* * * * *